United States Patent [19]

McCartin et al.

[11] Patent Number: 4,869,996
[45] Date of Patent: Sep. 26, 1989

[54] PROCESS FOR PREPARING NEGATIVE IMAGES ON A POSITIVE-TYPE TONABLE PHOTOSENSITIVE ELEMENT

[75] Inventors: Peter J. McCartin, Princeton Junction; Eugene L. Grubb, Colts Neck; Robert P. Held, Englishtown; Howard Matrick, Highlands; Bohdan Rakoczy, East Brunswick, all of N.J.

[73] Assignee: E. I. Du Pont De Nemours and Company, Wilmington, Del.

[21] Appl. No.: 134,877

[22] Filed: Dec. 18, 1987

[51] Int. Cl.$^4$ .......................... G03C 1/68; G03C 5/00
[52] U.S. Cl. .................................. 430/286; 430/291; 430/293; 430/330; 430/965
[58] Field of Search ............... 430/291, 293, 965, 330, 430/286

[56] References Cited

U.S. PATENT DOCUMENTS

| | | | |
|---|---|---|---|
| 3,060,024 | 10/1962 | Burg et al. | 96/28 |
| 3,260,612 | 7/1966 | Dulmage et al. | 430/291 |
| 3,487,764 | 1/1970 | Borden et al. | 430/291 |
| 3,649,268 | 3/1972 | Chu et al. | 96/27 R |
| 4,076,536 | 2/1978 | Schlesinger et al. | 430/291 |
| 4,174,216 | 11/1979 | Cohen et al. | 430/257 |
| 4,243,741 | 1/1981 | Abele et al. | 430/270 |
| 4,247,619 | 1/1981 | Cohen et al. | 430/253 |
| 4,273,842 | 6/1981 | Nonogaki et al. | 430/25 |
| 4,604,340 | 8/1986 | Grossa | 430/270 |
| 4,698,293 | 10/1987 | Grossa | 430/291 |
| 4,806,451 | 2/1989 | Frohlich | 430/291 |

Primary Examiner—Paul R. Michl
Assistant Examiner—C. D. Rodee
Attorney, Agent, or Firm—Annette L. Richter

[57] ABSTRACT

An improved process for preparing negative images from a photohardenable tonable element, wherein the unexposed photohardenable tonable element is tacky in a preselected temperature range, $T_1$-$T_2$, in which temperature range the exposed photosensitive tonable element is nontacky but wherein the exposed element is retackifiable at elevated temperatures above $T_2$. After imagewise exposure the unexposed areas have a colorless toning material applied to them at a temperature within the range $T_1$-$T_2$ to make them nontacky at temperatures of at least up to $T_3$, which is greater than $T_2$. After heating to an elevated temperature above $T_2$ but less than $T_3$ the exposed areas have a contrasting toning material applied to them to give a negative or reverse image.

41 Claims, No Drawings

PROCESS FOR PREPARING NEGATIVE IMAGES ON A POSITIVE-TYPE TONABLE PHOTOSENSITIVE ELEMENT

FIELD OF THE INVENTION

The invention relates to image reproduction systems that employ a larger of photohardenable composition to modulate the adherence of image readout material. More particularly, this invention relates to a process whereby a positive-type photohardenable element can be used to obtain either a negative or a positive image, as well as photosensitive elements especially suited for use in such processes.

BACKGROUND OF THE INVENTION

The prior art describes various image reproduction systems and processes that employ photohardenable materials to produce either positive or negative multicolored images. Assignee's patent, Chu et al., U.S. Pat. No. 3,649,268, describes a positive-working image reproduction process employing a layer of photohardenable material on a transparent removable base support. The process comprises laminating the photohardenable layer to a suitable receptor, imagewise exposing the layer through the support to actinic radiation thereby raising the tack temperature of the exposed areas, stripping the support from the layer, and dusting the surface with a colored material which selectively adheres to the unexposed areas of the layer to develop the image. By repeating the laminating, exposing, stripping, and dusting steps in sequence with different color separation records and corresponding toners, a multicolored image is obtained. This kind of photosensitive element, which produces a positive image of the photographic transparency used, is also referred to as a "positive-type" film.

U.S. Pat. No. 3,060,024, to Burg and Cohen, is directed to a positive-working thermal image transfer process which utilizes a photopolymerizable layer. The photopolymerizable layer is imagewise exposed, heated to the tack temperature of the unexposed or underexposed image areas and dusted with a particulate toner so that toner adheres selectively to the tacky image areas. The imagewise-toned photopolymerizable layer is then brought into contact with a receptor, heated to the transfer temperature, subjected to pressure, and, while still warm, separated, whereby the toner particles and underlying photopolymerizable material are transferred to the receptor, giving a positive or duplicate image of the transparency used. The dusting and heat transfer steps may be repeated to produce multiple copies with successive image degradation.

Negative-working reproduction systems which utilize a phototackifiable layer to produce an image are also known. For example, U.S. Pat. No. 4,243,741 teaches a negatively tonable material which contains a combination of at least one dihydropyridine compound and at least one bisimidazole compound. The production of image is based on the photochemical dissociation of bisimidazoles to form tacky, low molecular weight cleavage products. In order to obtain satisfactory image quality, however, it is necessary to prevent recombination of the cleavage products. This can be done by decreasing the viscosity of the layers through internal or external plasticization, thereby increasing the mobility of the cleavage products in the layer. Such layers have a tendency to stain, however, and diffusion or evaporation of the plasticizers from the layers may result in poor storage stability, variable sensitometric properties, and variability of toning.

A negatively tonable reproduction material utilizing photosensitive diazonium salts which form hygroscopic decomposition products is known from U.S. Pat. No. 4,273,842. The decomposition products become tacky and tonable by absorbing water. To achieve uniform toning, however, exposure and toning must be carried out under conditions of carefully controlled humidity. In addition, these layers have a tendency to excessive tackiness and the diazonium salts must be present in crystalline form at least on the surface of the layer or the layer will be tacky even before exposure. This leads to poor differentiation between exposed and unexposed areas, as well as fogging and spot formation.

Another negatively tonable imaging system is taught by U.S. Pat. No. 4,604,340. The photosensitive element of this system is a 4-(2-nitrophenyl)-1,4-dihydropyridine compound which becomes tacky and tonable on exposure to light. The exposing and toning steps may be repeated several times as desired using different images for exposure and different powders for toning. U.S. Pat. No. 4,698,293, on the other hand, teaches a positively tonable image reproduction system that utilizes a light-sensitive layer containing at least one 1,4-dihydropyridine. The light-sensitive layer is exposed imagewise, treated with a strong acid, post-exposed diffusely to produce tacky areas, and subsequently toned with a particulate toner.

In Assignee's patents, Cohen et al., U.S. Pat. Nos. 4,247,619 and 4,174,216, a negative working multilayer photosensitive tonable element and the process for image reproduction using it are described. This element comprises a cover sheet; a photoadherent layer; a tacky a nonphotosensitive contiguous layer receptive to colorant or particulate material for applications such as color proofing; and, optionally, a sheet support. The image reproduction process comprises (a) imagewise exposing the multilayered photosensitive element to actinic radiation, (b) stripping off the cover sheet from the element with the exposed areas of the photohardenable layer adhered to the cover sheet while the nonexposed areas of said photoadherent layer remain on the contiguous layer, and (c) toning by embedding colorant or particulate material in the areas of the contiguous layer uncovered by removal of the overlying photoadherent layer.

One method of manufacturing the above described multilayer photosensitive element is by first coating the photoadherent layer on the cover sheet, drying, and then solvent coating the contiguous layer on the dried photoadherent layer. After drying this layer the element may be laminated to a support. One problem with this process is that the solvent used for coating the contiguous layer has to be carefully chosen so as to have a deleterious effect on the photoadherent layer. Another method of manufacture involves coating the photoadherent layer on the cover sheet and the contiguous layer on the support. After drying, the photoadherent layer and the contiguous layer are laminated together under pressure, either at room temperature or elevated temperatures. A third method involves extrusion coating the photoadherent layer and contiguous layer simultaneously and in that order on the cover sheet, and then laminating the support to the outer surface of the contiguous layer.

The above described manufacturing processes are expensive since they involve coating of two separate layers. Further, the image reproduction process is subject to operator-induced variability since it relies on altering the balance of the adhesive forces between the layers of a multilayer element by exposure to actinic radiation.

The process of the invention allows an easily manufactured "positive-type" film, comprising a support, a photohardenable layer, and, optionally, a transparent cover sheet, to be used to produce either a positive or a negative image.

BRIEF SUMMARY OF THE INVENTION

This invention relates to a process for preparing an image on a photosensitive element, comprising a photohardenable tonable layer on a support, comprising the steps of:

(A) providing a photosensitive element wherein the unexposed photohardenable layer is tacky and tonable at temperatures in a preselected range, $T_1$-$T_2$, in which temperature range the exposed photohardenable layer is nontacky, and wherein said exposed photohardenable layer is retackifiable by heating to a temperature above $T_2$;

(B) exposing said photohardenable layer imagewise to actinic radiation to produce imagewise tacky and complementary nontacky image areas;

(C) applying at a temperature in the range, $T_1$-$T_2$, a first toning material which adheres selectively to the tacky image areas; and (D) removing said first toning material from the nontacky image areas;

the improvement comprising:

(a) applying in step (C) above a first toning material which renders the tacky image areas nontacky at least up to a temperature, $T_3$, which is greater than $T_2$;

(b) retackifying said exposed image areas by heating to a temperature which is greater than $T_2$ but less than $T_3$;

(c) applying at a temperature in said range, $T_2$-$T_3$, a second, contrasting toning material which adheres selectively to the retackified exposed image areas; and (d) removing said second toning material from the nontacky image areas.

The invention relates further to a process for producing a negative or reverse image on a photosensitive element as described above, wherein the first toning material applied in step (C) is clear or uncolored. These elements are particularly useful in a process for preparing negative multi-layer, multi-color images.

DETAILED DESCRIPTION OF THE INVENTION

This invention is a dry process whereby a positive-type photosensitive element can be used to prepare an image which is either positive or negative with respect to the photographic transparency employed. By dry process is meant a process in which no liquids need be used. The process uses a "positive-type" photosensitive element comprising a photohardenable layer on a support with, optionally, a transparent cover sheet over the photohardenable layer. The photohardenable layer may be formulated to be either tacky or nontacky at ambient temperatures, as desired.

The process whereby such an element may be used to prepare a positive image is well known in the prior art and involves an imagewise exposure, followed by a single application of toning material under conditions which differentiate between tacky unexposed image areas and nontacky exposed image areas. The prior art does not teach, however, how a negative image may be prepared on such a positive-type element.

The process of the invention allows an easily manufactured positive-type element to be used to prepare a negative image. The process utilizes two separate applications of contrasting toning materials. Moreover, each application of toning material must be carried out at a different temperature. The photohardenable composition of the invention must be formulated so that there is a temperature range, $T_{1-2}$, in which the unexposed image areas are tacky and tonable, but the exposed image areas are nontacky. This imagewise tacky/nontacky differential creates a latent image which can be developed by a first application of toning material at a temperature in said temperature range, $T_1$-$T_2$. It is further required for the invention, however, that the exposed photohardened image areas can be retackified by heating to a practical elevated temperature above $T_2$, which is below the softening, wrinkling, or distortion temperature of the support or receptor, or the temperature at which excessive softening, liquidification, or flow of the photohardenable composition occurs. The first toning material selectively adheres to the tacky unexposed image areas and renders them nontacky at least up to $T_3$, which is a temperature greater than $T_2$. The second, contrasting toning material is then applied to the retackified image at a temperature in the range $T_2$-$T_3$.

In general, the process of the invention comprises (1) exposing imagewise to actinic radiation a photohardenable element as described above; (2) applying to the tacky, unexposed image areas at a temperature in the range $T_1$-$T_2$, a first toning material which renders the unexposed areas nontacky at temperatures at least up to a temperature, $T_3$, which is greater than $T_2$; (3) retackifying the exposed image areas by heating the element to an elevated temperature which is greater than $T_2$ but less than $T_3$; and (4) applying at an elevated temperature in said range, $T_2$-$T_3$, a second contrasting toning material which adheres selectively to the retackified exposed image areas.

In a preferred process, the first toning of the unexposed image areas is carried out with a clear, colorless toning material. When exposed retackified image areas are then visualized by application of the desired contrasting toning material, a negative or reverse image is formed.

The unexposed photohardenable composition can be formulated to be either tacky or nontacky at ambient temperatures, as is desired. A photohardenable layer which is nontacky at room temperatures may be easier to handle in certain respects than a tacky layer. On the other hand, such an element must be heated to a temperature in the range, $T_1$-$T_2$, where an imagewise tacky/nontacky differential exists prior to the first application of toning material. A photohardenable layer which is tacky at ambient temperatures may require greater care in handling, but the first application of toning materials can be carried out without any special heating step.

In a preferred embodiment which is tacky at ambient temperatures, the photohardenable layer is tacky and tonable at temperatures above about 50° F. (10° C.) before exposure, and, when fully exposed, is nontacky at temperatures in the range of about 50° to 100° F. (10° to 37.8° C.), but is retackifiable by heating to elevated temperatures of about 120° to 240° F. (49°-116° C.) for the second toning step.

After imagewise exposure to actinic radiation, the first toning material is applied to the tacky unexposed image areas at a temperature of 50° to 100° F. (10° to 37.8° C.). This first, preferably colorless toning material renders the unexposed image areas nontacky up to a convenient temperature for retackification, preferably up to about 250° F. (121° C.). The fully exposed image areas are then retackified by heating the element to a temperature in the range of 120° to 240° F. (49° to 116° C.), and developed by applying at such a temperature, a contrasting toning material which adheres selectively to the retackified exposed areas to give a negative or reverse image. Most preferably the fully exposed areas are retackifiable by heating the element to a temperature in the range of 160° to 200° F. (71° to 93° C.).

In a preferred embodiment which is nontacky at ambient temperatures, the unexposed photohardenable layer becomes tacky and tonable above about 120° F. (49° C.), but when fully exposed is nontacky up to about 190° F. (82° C.) but is retackifiable by heating to a temperature of about 195° to 240° F. (90 to 116° C.).

The terms "photohardenable" or "photopolymerizable" as used herein refer to systems in which the molecular weight of at least one component of the photosensitive layer is increased by exposure to actinic radiation sufficiently to result in a change in the rheological and thermal behavior of the exposed areas so that they are nontacky at temperatures in a preselected range, $T_1-T_2$, preferably about 50° to 100° F. (10° to 37.8° C.), but can be retackified by heating to a practical temperature above $T_2$, i.e., a temperature which is below the softening, wrinkling, or distortion temperature of the support or receptor, and below temperatures at which excessive softening, liquidification, or flow of the photohardenable layer or volatilization of certain components occurs, preferably a temperature in the range of about 120° to 240° F. (49° to 116° C.), and most preferably in the range of about 160° to 200° F. (71° 93° C.).

Among the suitable photopolymerizable or photohardenable systems are: (1) those in which a photopolymerizable monomer is present alone or in combination with a compatible binder or (2) those in which the polymerizable group is attached to a polymer backbone. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical act. Alternatively, where dimerization of similar compounds is involved, e.g., benzophenone and cinnamoyl compounds, the average molecular weight of the photosensitive constituent can be doubled by each single photochemical act. Where a photopolymerizable molecule has more than one reactive site, a crosslinked network can be produced.

Photohardenable compositions capable of being retackified at practical temperatures after an initial photohardening may in general be formulated in two ways: (1) monomeric tackification, and (2) incorporating a binder having a low tack temperature. To produce such a retackifiable photopolymerizable composition by monomeric tackification requires incorporation of high concentrations of monomer, together with incomplete photopolymerization, so that significant concentrations of monmer remain after exposure. Alternatively, reliance on the inherent bulk property, i.e., tack temperature, of the polymerized composition requires lower than usual concentrations of monomer and selection of a binder with a low tack temperature.

The latter method is preferable; i.e., the retackifiable photohardenable composition should be formulated with a low tack temperature binder and a lower than usual concentration of monomer, so that in exposed areas, the tack temperature of the combination of crosslinked monomer and binder is above the first toning temperature. In this case, the low tack temperature of the binder predominates in providing tack for the second toning step, since the crosslinked monomer has a minimal effect on the tack temperature of the composition as a whole, compared with formulations having higher monomer concentrations, such as that of Example 9. The "bulk tack temperature" comes from the combination of binder and crosslinked monomer. If the concentration of crosslinked monomer (which generally has a high tack temperature) is too high, the resultant tcak temperature of the composition is too high in the exposed areas and the negative working process is difficult to operate and has poor latitude. As a consequence it is necessary to significantly underexpose a monomer-tackified formulation in order to retain some residual tack at an elevated temperature after exposure, but underexposure has a detrimental effect on image quality, resulting, e.g., in compressed or shortened half tone response, poor process latitude, and inability to hold highlight dots.

Photopolymerizable systems such as those disclosed in U.S. Pat. No. 3,649,268, which contain only high tack temperature polymeric binders or a preponderance of such binders can be used in the process of the invention provided the element is significantly underexposed, e.g., approximately one sixth the usual exposure time. The exposure must cause sufficient polymerization to render the exposed areas nontacky at room temperature or a first toning temperature but allow retackification at a elevated temperature in the range of 120° to 240° F.. Underexposure results in sufficient monomer being left behind in the exposed areas to act as a plasticizer for the polymer, thereby reducing the tack temperature of the composition as a whole in the exposed areas. Nevertheless, it is generally undesirable to underexpose to such an extent since exposure latitude is lost and small variations in exposure time may be associated with substantial variability of results.

In general to produce monomeric tackification in the photohardened area, the composition must be sufficiently underexposed so that incomplete polymerization occurs, i.e., approximately 60% or less of the monomer is converted to polymer. Since the system still contains such a large proportion of the monomer, continued exposure will result in rapid polymerization. Small changes in exposure time will produce large variability of results since the slope of the polymerization/exposure curve is still at a steep point. In contrast, a system which utilizes a low tack temperature binder and a low concentration of monomer is retackifiable at practical temperatures even though 85 to 90% or more of the monomer is converted to polymer.

Preferred photohardenable layers include a free radical-initiated, chain propagating, addition polymerizable, ethylenically unsaturated compound; a polymeric binder having a low tack temperature; a free radical generating addition polymerization initiator; and, optionally, a plasticizer. The combination of monomer(s), binder(s), and initiator(s) is chosen such that the photohardenable composition is either tacky or nontacky at ambient temperatures as desired, and so that a tacky/nontacky differential between the unexposed and exposed areas exists over a convenient temperature range. Finally, the tack temperature of the fully exposed areas must be low enough to permit retackification within a practical temperature range, e.g., below the temperature at which softening, wrinkling, or distortion of the support or receptor, or excessive softening, liquidification, or flow of the photohardenable composition or volatilization of certain components occurs, most preferably in the range of about 160° to 200° F. (71°–93° C.). If the polymeric binder itself has a tack temperature of 160° to 200° F., then no plasticizer is required and the monomer can be fully consumed during the exposure process. However, any photopolymerizable composition can be used in the process of the invention so long as the exposed areas can be retackified at a convenient temperature above $T_2$ and below $T_3$.

Suitable free radical initiated, chain propagating, addition polymerizable, ethylenically unsaturated monomers for use in the simple monomer/polymer binder photopolymerizable layers are described, e.g., in Burg et al., U.S. Pat. No. 3,060,023; Celeste et al., U.S. Pat. No. 3,261,686; and Cohen et al., U.S. Pat. No. 3,380,831, the teaching of which is incorporated herein by reference.

Polymers for use in the monomer/binder system and preferred free radical addition polymerization initiators are described in U.S. Pat. No. 3,060,23, the teaching of which is incorporated herein by reference. In general, polymers or mixtures of polymers having Tg's (glass transition temperatures) in the range of 50° to 200° F. (10° to 93° C.) may be useful. It is frequently desirable to blend polymers of higher and lower Tg to get the overall or average desirable properties, e.g., tack temperature of exposed areas, coatability, film-forming characteristics, etc. Preferred polymeric binders having a tack temperature in the range of approximately 80° to 200° F. (26° to 93° C.) are acrylate and methacrylate copolymer resins, Tg of 86°–194° F. (30° to 90° C.). More preferred are acrylate and methacrylate copolymer resins with a Tg of 86°–122° F. (30° to 50° C.), and most preferably, a Tg of 95°–104° F. (35°–40° C.). Preferred photopolymerizable compositions of the invention will contain a preponderance of such low tack temperature resins.

One method of measuring tack temperature is as follows: a thin layer of polymer beads as supplied, or of finely powdered resin isolated from solution, is spread along a heated gradient temperature bar. After 5 minutes, a current of air (approximately 2 ft.$^3$/min. or 0.057 m.$^3$/min.) is directed across the bar, starting at the cool end, so as to blow off the resin. The temperature of the bar at the point where the air current fails to dislodge the resin particles is measured using a thermocouple and reported as the tack temperature. Commercial literature commonly reports the Tg (glass transition temperature) rather than tack temperature of polymers. There is no precise correlation between the Tg and the tack temperature for a particular resin, but tack usually occurs at a temperature somewhat below the Tg.

The photopolymerizable compositions of the invention may also contain plasticizers which are useful in lowering the tack temperature, and improving other performance characteristics of the film. The plasticizer may be a monomer itself, e.g., a diacrylate ester, or any of the common plasticizers compatible with the polymeric binder. Among the common plasticizers are dialkyl phthalates, polyethylene glycol, alkyl polyoxyethylenes and alkyl phosphates.

The thickness of the photohardenable layer can vary according to the stratum composition and the material used as a receptor. The number of layers of photopolymer in the element is dependent on the image being reproduced, the desired quality of the final product, and uses made of the final product.

The element may also have a removable cover sheet on the photohardenable layer, the cover sheet being less strongly adherent at room temperature to the photohardenable layer than is the support. In the preferred process, the cover sheet is removed from the photohardenable element and the photohardenable layer is laminated to a receptor prior to the exposure step.

Suitable base supports, receptors, and cover sheets are disclosed in U.S. Pat. No. 3,649,268, the teaching of which is incorporated herein by reference. A preferred base support is polyethylene terephthatlate.

The exposure of the photopolymerizable element may be through line or halftone transparencies. The transparency and the element may or may not be in contact, and although exposure may be made through either side in the case of an element that has both support and receptor of a transparent material, in a preferred method the element is exposed through the support side.

Since most of the photohardenable materials preferred in this invention generally exhibit their maximum sensitivity to actinic radiation in the ultraviolet range, the light source should furnish an effective amount of this radiation. Such sources include carbon arcs, mercury-vapor arcs, fluorescent lamps with special ultraviolet emitting phosphors, argon glow lamps, electronic flash units, photographic flood lamps, lasers, e.g., argon ion lasers, and ionizing radiation, e.g., electron beam, etc. The amount of exposure required for satisfactory reproduction of a given element is a function of the exposure time, type of light source used, and the distance between the light source and element.

After exposure, toning material is applied to the exposed element in two separate applications at different temperatures. The first toning step, carried out at a temperature in the range, $T_1-T_2$, utilizes a toning material which is preferably colorless or unpigmented and designed to make the unexposed areas toned with it nontacky at temperatures at least up to a temperature, $T_3$, which is greater than $T_2$. $T_3$ is preferably at least about 250° F. (121° C.); a lower temperature may be satisfactory so long as there is a suitable range, $T_2-T_3$, wherein the exposed image are tacky and tonable.

The first toning step may be carried out with unpigmented transfer layers or toning films comprising an unpigmented polymer coating on a flexible support. A preferred transfer layer consists essentially of at least two incompatible polymer phases, including a first polymer phase (a) in the form of discrete particles having a minimum film forming temperature greater than 50° C., and a second polymer phase (b) containing at least one thermoplastic and/or thermoplastic/elastomeric polymer whose minimum film-forming temperature when a latex is used, or whose glass transition temperature when a dissolved polymer is used, is at least 10° C. lower than the minimum film-forming temperature of polymer phase (a). Such coatings have a very low cohesive strength. These preferred toning films are described in detail in Froehlich, German application P 36

25 014.7, filed July 24, 1986, U.S.S.N. 066,125, filed June 24, 1987, the teaching of which is incorporated herein by reference.

As described in Example 9, particularly good image quality and resolution are achieved when the first toning material is a colorless particulate material and the second toning material is a colored film such as that taught by Froehlich.

It is desirable to utilize toning films rather than particulate toners with the image reproduction system of the invention, since use of toning films virtually eliminates staining of the background areas of the image which receive an application of clear or colorless toning material. It may be convenient to utilize a clear, colorless toning film as the first toning material and a colored toning film as the contrasting toning material. In order to achieve a satisfactory dot range with the toning films or transfer layers, however, it is necessary to employ a variable speed laminator to apply the toning films to the photosensitive layers of the invention, particularly with respect to their application to the retackified image areas. In general, it is necessary to apply the transfer layers more slowly than usual lamination rates and some experimentation may be required to determine optimum rates and temperatures for laminating a particular set of films together.

Although there are a number of advantages associated with toning films, there are also potential problems, including the propensity of such films to trap dirt, which then becomes a background artifact in the final proof. On the other hand, the use of particulate toners to prepare pre-press proofs is an established technology. Dry nonelectroscopic toners, their method of production, as well as improved surface coatings, are well known in the art, as for example, in Chu and Manger, U.S. Pat. No. 3,620,726; Gray, U.S. Pat. No. 3,909,282; Manger, Fickes, and Long, U.S. Pat. No. 4,215,193; Fickes, U.S. Pat. No. 4,397,941; Matrick, U.S. Pat. No. 4,546,072. The teaching of these patents is incorporated herein by reference.

The organic resin particles are described in Chu and Manger, U.S. Pat. No. 3,620,726, the teaching of which is incorporated hereinby reference. Suitable resin matrices include, e.g., polyvinyl chloride, cellulose acetate, cellulose acetate butyrate, polystyrene, and polymethylmethacrylate. Use of these known particulate toners without added pigment for the first toning step is unsatisfactory, however, when a colored particulate toner is to be applied in the second toning step. As described in Example 2, a standard nonelectroscopic cellulose acetate particulate toner does not satisfactorily detackify or seal the unexposed areas to permit the subsequent application of colored particulate toner to the retackified image areas without unacceptable staining of the background. It is possible that monomer or plasticizer migrates through the layer of clear or colorless toner. Colored toner particles then adhere to the tacky monomer, causing stain.

One solution is to use a clear or colorless toning film such as those described above for the first toning step. A continuous film tends to be more resistant or impervious to monomer migration. Alternatively, a clear fusible particulate toner may be employed. The clear fusible particulate toner is applied to the unexposed tacky image areas at a temperature in the range $T_1-T_2$. The toner is then fused by contact with heat to form a continuous film. This film must render the unexposed image areas nontacky at temperatures at least up to $T_3$, which is greater than $T_2$. Using a clear, colorless powder of small particle size as the first toning material has the advantage of forming a latent image with the high image quality of a positive-working particulate toned system, such as that taught in U.S. Pat. No. 3,644,268.

The clear, colorless fusible particulate toner must satisfy a number of requirements: The powder must be fusible to form a continuous film at a temperature, $T_4$, which is sufficiently above the temperature at which the colored toning material is applied. If the fusion temperature is too low, the fused film will be soft enough at the second toning temperature to accept colored toner. The congealing or freezing temperature and the melting temperature of the fusible toner must lie within a narrow enough range so that the film is sufficiently hard at the second toning temperature relative to the colored toner to prevent embedding or scratching. The melting of fusion temperature of the fusible toner must also be sufficiently low so that volatilization of components of the photohardenable layer does not occur during the fusion step. The fusible toner must be insoluble in, but wetted by the unexposed photohardenable layer to which it adheres. The monomer component of the photohardenable layer must also be insoluble in the fusible toner and must not diffuse into or through the fusible toner layer. This might cause softening or melting of the fusible toner layer or monomer penetration, which would allow adherence of the colored toner, thereby producing a positive image or a badly stained negative image.

Few materials possess all of the properties of hardness, insolubility, and melting point necessary in a fusible toner. It has been found that polyethylene does meet these requirements, but even among various polyethylene materials, structural requirements are quite narrow. The polyethylene must be free of branching or the material is too soft. The molecular weight must be in the range of 300-3000, preferably 500-1200. The molecular weight is an important determinant with respect to the melting point value and range. The particle size of the fusible toner is an important determinant with respect to image quality, as well as the ease of fusion, smoothness, and uniformity of the film formed upon melting. In order to form a film of the appropriate uniformity and smoothness, the polyethylene particles should be have a mean diameter of 0.5° to 15 micrometers, preferably 0.8 to 10 micrometers, and more preferably 1.0 to 7 micrometers. A narrow range is preferred since it produces a smoother and more uniform film.

Oxidized forms of polyethylene are not useful. Similar materials such as synthetic and natural waxes, including various hydrocarbons, Carnauba wax, fatty acid amides, Fischer-Tropsch waxes, and microcrystalline waxes, are too soft.

In the second toning step, carried out at a temperature above $T_2$ but less than $T_3$, a contrasting toning material is applied to the retackified exposed image areas to give a reverse or negative image of the transparency used. Application of a first clear or uncolored toning material, followed by a colored toning material, will produce a conventional reverse or negative image. Skilled artisans in the field may choose to produce various decorative effects by using other combinations of contrasting toning materials. Toners prepared as described in U.S. Pat. Nos. 4,330,613 and 4,546,072 or pigmented transfer layers, as described in the above identified Froehlich application, may be used as the second toning material, as well as electroless plating catalysts, a slurry of particulate material in an appropriate (i.e., nondeleterious) solvent, etc.

The foregoing discussion relates to a process which utilizes two toning steps to produce a negative or reverse image. It is understood, however, that the photopolymer layer of the invention can be used to prepare a positive image. In that case, a single application of a colored toning material in the temperature range $T_1$–$T_2$ is used.

The invention will be further illustrated by, but is not intended to be limited to the following detailed examples of various embodiments.

EXAMPLES

EXAMPLE 1

A tacky photopolymerizable composition such as that described in Example 1 of U.S. Pat. No. 4,461,823 was laminated at 250° F. (121° C.) to the smooth side of Kromekote® cast-coated one side paper, manufactured by Champion Paper and Fiber Company, using a Cromalin® Laminator Model 2700 manufactured by E. I. du Pont de Nemours and Company, Wilmington, DE and the element was overall exposed for 100 seconds to give a nontacky photopolymer coating on the paper support. The exposure equipment was a Montako® II Exposure Unit, manufactured by Exposure Systems Corporation, Bridgeport, CN, which is equipped with a Theimer Exposure Device, manufactured by Siegfried Theimer, GmbH, West Germany which has a 5 KW lamp and a Kokomo® No. 400 glass filter, Kokomo Opalescent Glass Company, Kokomo, IN.

A photopolymerizable layer was coated on a 0.004 inch (0.0102 cm) thick polypropylene film with a 0.004 inch drawdown knife and the dried layer was laminated to the nontacky polymer coating on the paper support described above. The photopolymerizable coating composition was as follows:

| INGREDIENTS | AMOUNT. (grams) |
| --- | --- |
| Terpolymer of ethyl acrylate, methyl methacrylate, and acrylic acid (56/37/7 wt %, respectively); Tg 37° C.; Acid no. of 80; Mw 260,000 | 474.0 |
| Tetraethylene glycol dimethacrylate | 234.0 |
| Polyoxyethylene(4)lauryl ether | 64.0 |
| 1,1'-Bis-(2-o-chlorophenyl-4,5-diphenyl imadazole) | 12.8 |
| 2-(Stilbyl-4'')-(naphtho-1',2':4,5)-1,2,-triazole-2'-sulfonic acid phenyl ester | 1.6 |
| 7-(4'-Chloro-6'-diethylamino-1',3',5'-triazine-4'yl)-amino-3-phenyl-coumarin | 8.0 |
| 2-Mercaptobenzoxazole | 6.4 |
| 2.2'-Dihydroxy-4-methoxybenzophenone | 0.7 |
| Hydroquinone | 0.42 |
| Methanol | 336.0 |
| Methylene chloride | 3865.0 |

The laminated element was imagewise exposed through a minus-red separation halftone negative for 20–30 seconds in the exposure device described above. After peeling off the polypropylene cover sheet, MPP-611XF, a micronized, linear, low molecular weight polyethylene, manufactured by Micro Powders, Inc., Scarsdale, NY was applied at ambient temperatures using a mohair pad. This material has the following typical properties: Melting point, 232° F. (111° C.); Congealing Point, 229° F. (109° C.); Penetration (hardness test) ATM D-1321, 0.1 mm ≃ 77° F.; Density 0.95; Average Particle Size, 2.0 micrometers.

The element was wiped with a LAS-TIK® cloth manufactured by LAS-TIK manufacturing Co., Hamilton, OH and placed on an aluminum hot plate at 240° F. ±5° (115.5° ±2.5° C.) to fuse the polyethylene. In this manner the unexposed image areas are rendered nontacky at temperature up to about 190° F. (88° C.). The temperature was controlled by a Microprocessor Based Temperature Controller, Model 6000, Omega Process Controls, Inc., Bridgeport, NJ. The element was then placed on an aluminum hot plate at 145° F. (range 145°–184° F.) (63°–84° C.) to retackify the exposed areas of the photopolymerizable element. A cyan particulate toner was applied at this elevated temperature to give a sharp reverse image (a positive) of the negative separation which was substantially free of background stain. The cyan toner is similar to that described in U.S. Pat. No. 4,546,072, Example 5B. When the negative separation was a Tint Guide, Beta Screen Corp., Fairlawn, NJ, a tonal range of at least 3%–97% dots was obtained at 50 lines per inch and 5%–97% dots at 165 lines per inch.

EXAMPLE 2

The procedure was repeated as in Example 1 except that a milled nonpigmented cellulose acetate toner, similar to Sample C2 as described in Example 1 U.S. Pat. No. 4,397,941, but lacking the pigment, replaced the polyethylene powder of the previous example. A reverse image (positive) of the separation negative was obtained that was so badly stained in the background areas as to provide little contrast with the toned areas.

EXAMPLE 3

The procedure was repeated as in Example 1 except that a particle size reduced polymethyl methacrylate powder was used in place of the polyethylene powder. This was prepared by micronizing Elvacite® 2008 manufactured by E. I. du Pont de Nemours and Company; Wilmington, DE. Micronization was carried out on an 8Micron-Master®. The Jet Pulverizer Co., Palmyra, NJ at 100-110 p.s.i. using a solid feed rate of 50 grams/minute. The particle size obtained was about 4 microns.

A reverse image (positive) of the separation negative was obtained that was badly stained in the background regions.

EXAMPLE 4

The procedure of Example 1 was repeated using Shamrock Neptune 1 N1, Shamrock Chemicals Corp., Newark, NJ, instead of MPP-611XF polyethylene powder. This material is a linear polyethylene with a melting point of 235° F. (113° C.) and a particle size of 5 micrometers. An especially sharp reverse image was obtained with this material.

EXAMPLE 5

The procedure of Example 1 was carried out using Shamrock S-394 N1, Shamrock Chemicals Corp., Newark, NJ, instead of the MPP-611XF polyethylene powder. This material is a linear polyethylene with a melting point of 235° F. (113° C.) and a particle size of 5 micrometers. A sharp reverse image with a strain free background was obtained.

EXAMPLE 6

The procedure of Example 1 was carried out using Polywax 1000, Petrolite Corp., Tulsa, Oklahoma, instead of MPP-611XF polyethylene powder. This material is a linear polyethylene with a melting point of 237° F. (114° C.), a penetration at 77° F. (25° C.) of 1, a penetration at 140° F.(60° C.) of 5, and a molecular weight of 1000. A shapr reverse image with a stain free background was obtained.

EXAMPLE 7

The procedure of Example 1 was carried out using Siltek M, Petrolite Corp., Tulsa, Oklahoma, instead of MPP-611XF polyethylene powder. This material is a linear polyethylene with a melting point of 219° F. (104° C.), and a molecular weight of 750. A sharp reverse image with a stain free background was obtained.

EXAMPLE 8

The procedure of Example 1 was carried out using Microfine CP-9A, Dura Commodities Corp., Harrison, NY, instead of MPP-611XF polyethylene powder. This material is a linear polyethylene with a melting point of 213° F. (101° C.), and a molecular weight of 1000. A sharp reverse image with a stain free background was obtained.

EXAMPLE 9

A positive-working photopolymerizable element similar to that described in U.S. Pat. No. 4,356,253 was prepared, having a 0.0003 inch (0.00076 cm) photopolymer layer coated on a 0.0005 inch (0.0013 cm) polyethylene terephthalate film support, and covered by a suitable 0.00075 inch (0.0019 cm) polypropylene cover sheet. The photopolymerizable composition was as follows:

|   | INGREDIENTS | AMOUNT (grams) |
|---|---|---|
| 1. | Polymethylmethacrylate, Mw, 629,000; Mn, 129,000; P.D.I., 4.861[1], Tg 95° C. | 25.0 |
| 2. | Polyvinyl acetate, Mw, 120,000; P.D.I., 234[2], Tg 30-35° C. | 10.0 |
| 3. | Trimethylolpropanetrimethacrylate | 28.00 |
| 4. | polyoxyethylatedtrimethylolpropane-triacrylate, molecular weight 1162 | 6.0 |
| 5. | 2-o-Chlorophenyl-4,5-bis-(m-methoxyphenyl)-imidazolyl dimer | 1.2 |
| 6. | Polyoxyethylene (4) lauryl ether | 6.0 |
| 7. | Hydroquinone | 0.04 |
| 8. | 2-Mercaptobenzoxazole | 0.60 |
| 9. | Optical brightener[3] | 0.16 |
| 10. | Optical brightener[4] | 0.80 |
| 11. | 2,2'-Dihydroxy-4-methoxybenzophenone | 0.06 |

[1]Mw is weight average molecular weight; Mn is number average molecular weight; P.D.I is polydispersity index, which equals Mw/Mn determined by G.P.C. (gel phase chromatography).
[2]Same meaning as [1] above but determined by S.E.C. (size exclusion chromatography).
[3]2-(Stilbyl-4")-naphtho-1',2':4,5)-1,2,3 triazole-2"-sulfonic acid phenyl ester.
[4]7-(4'-Chloro-6'-diethylamino-1',3',5'- triazine-4'-yl)amino-3-phenyl coumarin.

The unexposed photohardenable layer is tacky and tonable at ambient temperatures above about 50° F. (10° C.). The tack temperature of the exposed photohardened image areas is about 110° F. (43° C.) when significantly underexposed, about 3-4 seconds exposure time. When fully exposed, about 45 seconds, the tack temperature is about 300° F. (149° C.), so that retackification requires temperatures too high to be practical.

The cover sheet was removed at room temperature and the layer was laminated at 126° C. to the smooth side of Kromekote ® cast-coated one-side paper, manufactured by Champion Paper and Fiber Company, using a Cromalin ® Laminator Model 2700 manufactured by E. I. du Pont de Nemours and Company, Wilmington, DE. The element was overall exposed for about 45 seconds to give a nontacky photopolymer coating on the paper support. A second photopolymerizable element of the same composition was laminated to the coated paper as described. This element was exposed through the support for 4 seconds on a MontaKop ® II Exposure Unit, equipped with a Theimer Exposure Device, which has a 5 KW lamp and a Kokomo ® glass filter (No. 400), through a minus-red separation halftone negative whereby the exposed areas became nontacky and the uenxposed areas remained tacky. The exposed element was securely taped to a suitable flat surface, and the polyethylene terephthalate film support was stripped by pulling at one corner with an even, continuous motion at an angle of 100° C. to 150°. A clear, unpigmented cellulose acetate toner having a 2.5 μm mean particle size, which had been surface coated with 4% silicone oil, similar to Sample C2, Example 1 of U.S. Pat. No. 4,397,941, was applied at a temperature of 75° F. (24° C.) to the image-bearing surface using a toner applicator and application method as described in Sandner, U.S. Pat. No. 4,019,821. This application of clear toner rendered the unexposed iamge areas nontacky.

The second toning step used a magenta colored film having the following composition and using the process described below.

The magenta toning film was prepared by coating a layer having the following composition onto a 0.001 inch (0.0025 cm) thick polyethylene terephthalate film base to give a coated layer having a dried thickness of 0.00012 inch (0.0003 cm).

| INGREDIENTS | AMOUNT (grams) |
|---|---|
| Rhoplex ® B-85, an acrylic polymer manufactured by Rohm & Haas, Philadelphia, PA | 72.0 |
| FLEXACRYL EXP-1685 manufactured by Air Products Corp., Allentown, PA | 12.5 |
| Quindo ® Magenta (Pigment Red 122, Harmon Colors Division, Mobay Chemical Corp., Haledon, NJ) | 8.5 |
| Indo ® Brilliant Scarlet Toner (Pigment Red 123, C.I. No. 71145) Mobay Chemical Corp. | 1.6 |
| Sodium lauryl sulfate | 0.25 |
| Octylphenoxy polyethoxy ethanol, a nonionic surfactant ($C_{24}H_{42}O_6$) | 1.0 |
| Octylphenoxy polyethoxy ethanol, a nonionic surfactant ($C_{46}H_{86}O_{17}$) | 1.0 |
| Acrysol ® I62, viscosity of 500 cps, Rohm and Haas Company Bristol, PA | 0.5 |
| Nopco ®NXZ, Diamond Shamrock Company, Morristown, PA | 0.15 |
| Polyethylene oxide | 1.6 |
| Fluorosurfactant FT929 Bayer Chemical Co., West Germany | 0.6 |
| Zonyl ® FSA, Du Pont, Wilmington, DE | 0.3 |

After wiping to remove excess clear toner, the element was laminated with the magenta colored toning film at 180° F. (82° C.) and a speed of 1 ft/minute (0.2 cm/sec). The polyethylene terephthalate film base support with its adherent nonimage areas of the toning film was then peeled off to give a sharp magenta reverse image having a density of 1.2 with no background stain.

EXAMPLE 10

Example 9 was repeated with the following exceptions: a clear unpigmented film was used in the first toning step instead of the clear cellulose acetate toner. This film was prepared by coating a layer similar in composition to the toning film of Example 9 but lacking pigment, 0.00008 inches (0.0002 cm) thick onto a 0.001 inch (0.0025 cm) thick polyethylene terephthalate film support.

After exposure the cover sheet was peeled off the photosensitive element, and the clear unpigmented film was laminated to it at 75° F. (23.9° C.) and a speed of 1 ft/min (0.2 cm/sec).

The magenta toning film was applied at a temperature of 180° F. (82° C.) and a lamination speed of 2 ft/min. After the toning film support with its adherent coating in the nonimage areas was peeled off, a sharp reverse image having a density of 1.2 was obtained with no significant background stain.

EXAMPLE 11

The process of Example 9 was repeated with the following exceptions: the photohardenable layer in the photopolymerizable elements used had the following composition:

| INGREDIENTS | AMOUNT (grams) |
| --- | --- |
| Terpolymer of ethyl methacrylate (40%)/ethyl acrylate(48%)/methacrylic acid (12%), Mw 180,000, Tg of 35° C. | 68.25 |
| Tetraethylene glycol dimethacrylate | 19.5 |
| Polyoxyethylene lauryl ether | 8.0 |
| Bis-(2-o-chlorophenyl-4,5-diphenyl imidazole) | 1.6 |
| 2-(stilbyl-4")-(naphtho-1',2':4,5)-1,2,3-triazole-2"-sulfonic acid phenyl ester | 0.2 |
| 7-(4'-chloro-6'-diethylamino-1',3',5'-triazine-4'-yl) amino-3-phenyl coumarin | 1.0 |
| 1,4,4-trimethyl-2,3-diazabicyclo-[3.2.2]-non-2-ene-N—dioxide | 0.03 |
| 2-mercaptobenzoxazole | 0.8 |
| 2,2'-dihydroxy-4-methoxybenzophenone | 0.15 |
| Hydroquinone | 0.05 |
| Polyox WSR-N—3000 (Union Carbide 1007) | 0.5 |

This photohardenable composition is tacky at temperatures above about 30° F. (−1° C.) when unexposed. The tack temperature of the fully exposed photohardened image areas is about 180° F. (82° C.).

The photopolymerizable element was exposed through a black printer negative for 20 seconds. Also, the second toning material was a black color toning film comprising a black coating on a polyethylene terephthalate film support instead of the magenta toning film. Lamination of the black film took plate at 3 ft/min (0.6 cm/sec). The black coating had the following composition:

| INGREDIENTS | AMOUNT (grams) |
| --- | --- |
| Rhoplex ® B-85, an acrylic polymer manufactured by Rohm & Haas, Philadelphia, PA | 74.5 |
| FLEXACRYL EXP-1685 manufactured by Air Products Corp., Allentown, PA | 8.3 |
| Mogul ® L carbon black, C.I. No. 77266, Cabot Corp., Carbon Black Division, Boston, MA | 12.0 |
| Sodium lauryl sulfate | 0.3 |
| Octylphenoxy polyethoxy ethanol, a nonionic surfactant ($C_{24}H_{42}O_6$) | 1.1 |
| Octylphenoxy polyethoxy ethanol, a nonionic surfactant ($C_{46}H_{86}O_{17}$) | 1.1 |
| Acrysol ® I62, viscosity of 500 cps, Rohm and Haas Company, Bristol, PA | 0.5 |
| Nopco ® NXZ, Diamond Shamrock Company, Morristown, PA | 0.2 |
| Polyethylene oxide | 1.25 |
| Fluorosurfactant FT929, Bayer Chemical Co., West Germany | 0.5 |
| Zonyl ®, Du Pont, Wilmington, DE | 0.25 |

After peeling off the polyethylene terephthalate toning film support with the adherent coating in the nonimage areas, a sharp, reverse, positive, black image having a density of 0.75 with no significant background color was obtained.

The color sheet was removed from a third photopolymerizable element similar to that described earlier in this example, and the photopolymer layer was laminated to the black imaged layer obtained above, at a temperature of 250° F. (121.1° C.). This element was then exposed through a minus-blue separation half-tone negative for 20 seconds. After toning at a temperature of about 74° F. (23° C.) with a clear toner similar to that described in Example 9, and wiping, the element was laminated at 180° F. (82.2° C.) and at 3 ft/min (1.5 cm/sec) with a yellow toning film comprising a yellow coating 0.00012 inch (0.0003 cm) thick on a 0.001 inch (0.0025 cm) thick polyethylene terephthalate film support. The yellow coating had the following composition:

| INGREDIENTS | AMOUNT (grams) |
| --- | --- |
| Rhoplex ® B-85, an acrylic polymer manufacture by Rohm & Haas, Philadelphia, PA | 78.4 |
| FLEXACRYL EXP-1685 manufactured by Air Products Corp., Allentown, PA | 8.0 |
| Dalamar ® Yellow (Pigment Yellow 74, C.I. No. 11741) Heubach Inc., Newark, NJ | 8.2 |
| Sodium lauryl sulfate | 0.2 |
| Octylphenoxy polyethoxy ethanol, a nonionic surfactant ($C_{24}H_{42}O_6$) | 0.8 |
| Octylphenoxy polyethoxy ethanol, a nonionic surfactant ($C_{46}H_{86}O_{17}$) | 0.8 |
| Acrysol ® I62, viscosity of 500 cps, Rohm and Haas Company, Bristol, PA | 0.4 |
| Nopco ® NXZ, Diamond Shamrock Company, Morristown, PA | 0.2 |
| Polyethylene oxide | 2.0 |
| Fluorosurfactant FT929, Bayer Chemical Co., West Germany | 0.8 |
| Zonyl ®, Du Pont, Wilmington, DE | 0.4 |

The polyethylene terephthalate toning film support was then peeled off to give a black and yellow positive image. The steps of laminating a fresh photopolymerizable layer onto the previously toned layer, exposing with a different color-separation negative, toning with a clear, unpigmented toner, wiping, laminating with an appropriately colored toning film, and peeling off the support were repeated twice to give a four-color surprint element. In the first repetition, the exposure was through a minus-green separation half-tone negative, and a magenta toning film similar to that described in Example 9 was applied.

For the second repetition, exposure was through a minus-red separation half-tone negative, and a cyan toning film comprising of a 0.00016 inch (0.0004 cm) thick cyan coating on a 0.001 inch (0.0025 cm) thick polyethylene terephthalate film support was used. The cyan coating had the following composition:

| INGREDIENTS | AMOUNT (grams) |
|---|---|
| Rhoplex ® B-85, an acrylic polymer manufactured by Rohm & Haas, Philadelphia, PA | 78.0 |
| FLEXACRYL EXP-1685 manufactured by Air Products Corp., Allentown, PA | 14.3 |
| Monastral ® Blue G (copper phthalocyanine, Pigment Blue is, C.I. No. 74160) | 3.9 |
| Ramapo Green, (perchloro copper phthalocyanine, Pigment Green 7, C.I. No. 74260) | 0.1 |
| Sodium lauryl sulfate | 0.1 |
| Octylphenoxy polyethoxy ethanol, a nonionic surfactant ($C_{24}H_{42}O_6$) | 0.4 |
| Octylphenoxy polyethoxy ethanol, a nonionic surfactant ($C_{46}H_{86}O_{17}$) | 0.42 |
| Acrysol ® I62, viscosity of 500 Cps, Rohm and Haas Company, Bristol, PA | 0.15 |
| Nopco ® NXZ, Diamond Shamrock Company, Morristown, PA | 0.05 |
| Polyethylene oxide | 1.6 |
| Fluorosurfactant FT929, Bayer Chemical Co., West Germany | 0.6 |
| Zonyl ®, Du Pont, Wilmington, DE | 0.3 |

To provide a protective covering, another photopolymerizable layer was laminated to the cyan imaged layer and given a 2 to 3 minute overall exposure. The resulting four-color surprint proof exhibited a sharp positive image and had no measurable background stain.

EXAMPLE 12

The procedure described in Example 11 was repeated with the following exception: A clear unpigmented toning film as described in Example 10 was used for the first application of toning material instead of the clear particulate toner. The clear film was laminated to the imagewise exposed photopolymer layer at 75° C. (23.9° C.) and at a rate of 1 ft/minute. The film support was peeled off prior to lamination with a colored film at a temperature of 180° F. (82° C.) and at a rate of 2 ft/minute.

A four color surprint proof with a sharp positive image and no measurable background stain was obtained.

EXAMPLE 13

The procedure described in Examples 1, 11, and 12 may be carried out with a photopolymerizable layer of the following composition:

| INGREDIENTS | AMOUNT (grams) |
|---|---|
| Terpolymer of methylmethacrylate ethylacrylate, and acrylic acid; Mol. Wt. 200,000, Acid No. 76–85, Tg of 40° C. | 68.7 |
| Trimethylolpropane trimethacrylate | 16.38 |
| Polyoxyethylated trimethylolopropane triacetate | 3.62 |
| Polyoxyethylene lauryl ether | 9.0 |
| Bis-(2-o-chlorophenyl-4,5-diphenyl imidazole) | 1.6 |
| 2-(stilbyl-4″)-(naphtho-1′,2′:4,5)-1,2,3-triazole-2″-sulfonic acid phenyl ester | 0.2 |
| 7-(4′-chloro-6′-diethylamino-1′,3′,5′-triazine-4′-yl) amino-3-phenyl coumarin | 1.0 |
| 2-mercaptobenzoxazole | 0.8 |
| 2,2′-dihydroxy-4-methoxybenzophenone | 0.09 |
| Hydroquinone | 0.03 |
| Methylene chloride/methanol (92:8) | 900.0 |

This photohardenable composition is tacky at temperatures above about 30° F. (−1° C.) when unexposed. The tack temperature of the fully exposed photohardened image areas is about 180° F. (82° C.).

A reverse image is formed.

EXAMPLE 14

A photopolymerizable element comprising a 0.0006 inch (0.0015 cm) thick polyethylene terephthalate film support, a 0.0003 inch (0.00076 cm) thick photopolymeriable layer and a 0.0006 inch (0.0015 cm) thick polypropylene film cover sheet was used. The photopolymerizable layer had the following composition:

| INGREDIENTS | AMOUNT (grams) |
|---|---|
| Methylmethacrylate/ethyl acrylate copolymer 87/13 - inherent viscosity 0.45, Tg 87° C. (189° F.) | 68.25 |
| Tetraethylene glycol dimethacrylate | 19.5 |
| Polyoxyethylene lauryl ether | 8.0 |
| Bis-(2-o-chlorophenyl-4,5-diphenylimidazole) | 1.6 |
| 2-(stilbyl-4″)-(naphtho-1′,2′:4,5)-1,2,3-triazol-2″-sulfonic acid phenyl ester | 0.2 |
| 7-(4′-chloro-6′-diethylamino-1′,3′,5′-triazine-4′-yl)amino-3-phenyl coumarin | 1.0 |
| 2-mercaptobenzoxazole | 0.8 |
| 2,2′-dihydroxy-4-methoxybenzophenone | 0.09 |
| hydroquinone | 0.03 |
| 1,4,4-trimethyl-2,3-diazabicyclo[3.2.2]-non-2-ene-N-dioxide | 0.03 |
| Polyox WSR-N—3000 (Union Carbide 1007) | 0.5 |
| Methylene chloride | 900 |

The procedure for preparing a negative proof was as described in Example 10, but the clear film is applied at a temperature of 125° F. (52° C.) and the colored film is applied at a temperature of 200° F. (93° C.).

EXAMPLE 15

The procedure of Example 1 is followed except that the terpolymer binder was replaced by a different terpolymer of ethylmethacrylate, ethylacylate, and methacrylic acid having an acid number of about 30. A reverse image was obtained.

EXAMPLE 16

The procedure in Example 1 is followed except that the terpolymer binder was replaced by a resin, Acryloid B-48N, Rohm & Haas, Philadelphia, PA, a methyl methacrylate copolymer with a Tg of 50° C. A reverse image was obtained.

We claim:

1. In a process for preparing an image on a photosensitive element, comprising a photohardenable tonable layer on a support, comprising the steps of:
   (A) providing a photosensitive element wherein the unexposed photohardenable layer is tacky and tonable at temperatures in a preselected range, $T_1$–$T_2$, in which temperature range the exposed photohardenable layer is nontacky, and wherein said exposed photohardenable layer is retackifiable by heating to a temperature above $T_2$;
   (B) exposing said photohardenable layer imagewise to actinic radiation to produce imagewise tacky and complementary nontacky image areas;
   (C) applying at a temperature in the range, $T_1$–$T_2$, a first toning material which adheres selectively to the tacky image areas; and
   (D) removing said first toning material from the nontacky image areas;

the improvement comprising:
   (a) applying in step (C) above a first toning material which renders the tacky image areas nontacky at least up to a temperature, $T_3$, which is greater than $T_2$;
   (b) retackifying said exposed image areas by heating to a temperature which is greater than $T_2$ but less than $T_3$;
   (c) applying at a temperature in said range, $T_2$–$T_3$, a second, contrasting toning material which adheres selectively to the retrackified exposed image areas; and
   (d) removing said second toning material from the nontacky image areas.

2. A process according to claim 1, the improvement further comprising providing a photohardenable layer which when fully exposed, is retackifiable by heating to a temperature no greater than about 240° F. (116° C.).

3. A process according to claim 2, the improvement further comprising providing a photohardenable layer which when fully exposed, is retackifiable by heating to a temperature no greater than about 200° F. (93° C.).

4. A process according to claim 3, wherein the photohardenable layer comprises an acrylate or methacrylate polymer or copolymer resin with a Tg of about 80° to 200° F. (26° to 93° C.).

5. A process according to claim 4, wherein the photohardenable layer comprises an acrylate or methacrylate polymer or copolymer resin with a Tg of about 86° to 122° F. (30° to 50° C.).

6. A process according to claim 2, the improvement further comprising providing in step (A) a photohardenable layer which before exposure is tacky and tonable at temperatures above about 50° F. (10° C.), and when fully exposed is nontacky at temperatures of about 50° to 100° F. (10° to 38° C.), but is retackifiable by heating to a temperature of about 120° to 240° F. (49° to 116° C.).

7. A process according to claim 6, wherein the fully exposed photohardenable layer is retackifiable by heating to a temperature of about 160° to 200° F. (71° to 93° C.).

8. A process according to claim 2, the improvement further comprising providing in step (A) a photohardenable layer which before exposure is tacky and tonable at temperatures above about 120° F. (49° C.), and when fully exposed is nontacky at temperatures up to about 190° F. (81.8° C.), but is retackifiable by heating to a temperature of about 195° to 240° F. (90.5° to 116° C.).

9. A process according to claim 1, the improvement further comprising applying in step (a) a first toning material which is colorless or unpigmented whereby a reverse or negative image is produced.

10. A process according to claim 2, the improvement further comprising applying in step (a) a first toning material which is colorless or unpigmented, whereby a reverse or negative image is produced.

11. A process according to claim 6, the improvement further comprising applying in step (a) a first toning material which is colorless or unpigmented whereby a reverse or negative image is produced.

12. A process according to claim 8, the improvement further comprising applying in step (a) a first toning material which is colorless or unpigmented whereby a reverse or negative image is produced.

13. A process according to claim 9, wherein the first, colorless or unpigmented toning material is a finely divided particulate material, and the second, contrasting toning material applied in step (c) is a toning film.

14. A process according to claim 10, wherein the first, colorless or unpigmented toning material is a finely divided particulate material, and the second, contrasting toning material applied in step (c) is a toning film.

15. A process according to claim 11, wherein the first, colorless or unpigmented toning material is a finely divided particulate material, and the second, contrasting toning material applied in step (c) is a toning film.

16. A process according to claim 12, wherein the first, colorless or unpigmented toning material is a finely divided particulate material, and the second, contrasting toning material applied in step (c) is a toning film.

17. A process according to claim 13, wherein the first clear or unpigmented toning material comprises finely divided cellulose acetate particles.

18. A process according to claim 14, wherein the first clear or unpigmented toning material comprises finely divided cellulose acetate particles.

19. A process according to claim 9, wherein the first, colorless or unpigmented toning material is a fusible finely divided particulate material, which is fused prior to application of the second, contrasting toning material in step (c).

20. A process according to claim 10, wherein the first, colorless or unpigmented toning material is a fusible finely divided particulate material, which is fused prior to application of the second, contrasting toning material in step (c).

21. A process according to claim 10, wherein the first, colorless or unpigmented toning material is a fusible finely divided particulate material, which is fused prior to application of the second, contrasting toning material in step (c).

22. A process according to claim 19, wherein the fusible finely divided particulate material is a linear, low molecular weight polyethylene, having a means particle diameter of 0.5 to 15 micrometer, and a molecular weight in the range of about 300 to 3000.

23. A process according to claim 22, wherein the polyethylene has a molecular weight in the range of about 500 to 1200.

24. A process according to claim 20, wherein the fusible finely divided particulate material is a linear, low molecular weight polyethylene, having a mean particle diameter of 0.5 to 15 micrometer, and a molecular weight in the range of about 300 to 3000.

25. A process according to claim 24, wherein the polyethylene has a molecular weight in the range of about 500 to 1200.

26. A process according to claim 21, wherein the fusible finely divided particulate material is a linear, low molecular weight polyethylene, having a mean particule diameter of 0.5 to 15 micrometer, and a molecular weight in the range of about 300 to 3000.

27. A process according to claim 26, wherein the polyethylene has a molecular weight in the range of about 500 to 1200.

28. A process according to claim 9, wherein the first toning material is a colorless or unpigmented toning film, and the second contrasting toning material applied in step (c) is a toning film.

29. A process according to claim 10, wherein the first toning material is a colorless or unpigmented toning film, and the second, contrasting toning material applied in step (c) is a toning film.

30. A process according to claim 11, wherein the first toning material is a colorless or unpigmented toning film and the second, contrasting toning material applied in step (c) is a toning film.

31. A process according to claim 9, wherein the first toning material is a colorless or unpigmented toning film, and the second, contrasting toning material applied in step (c) is a finely divided particulate material.

32. A process according to claim 10, wherein the first toning material is a colorless or unpigmented toning film, and the second, contrasting toning material applied in step (c) in a finely divided particulate material.

33. A process according to claim 11, wherein the first toning material is a colorless or unpigmented toning film, and the second, contrasting toning material applied in step (c) is a finely divided particulate material.

34. In a process of preparing a multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 1.

35. In a process of preparing a reverse multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 9.

36. In a process of preparing a reverse multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 10.

37. In a process of preparing a reverse muticolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 11.

38. In a process of preparing a reverse multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 13.

39. In a process of preparing a reverse multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 19.

40. In a process of preparing a reverse multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 28.

41. In a process of preparing a reverse multicolor image having at least two photoimaged, imagewise-colored elements sequentially laminated in register to a support, wherein each imagewise-colored photoimaged element has been exposed through a different color separation transparency and colored in a spectral region corresponding to the color separation used, the improvement wherein the photoimaged elements are prepared according to the process of claim 31.

* * * * *